United States Patent
Cai et al.

(10) Patent No.: US 12,200,966 B2
(45) Date of Patent: Jan. 14, 2025

(54) DISPLAY PANEL, MANUFACTURING METHOD THEREOF AND DISPLAY APPARATUS

(71) Applicant: Hubei Yangtze Industrial Innovation Center Of Advanced Display Co., Ltd., Wuhan (CN)

(72) Inventors: Yu Cai, Wuhan (CN); Junqiang Wang, Wuhan (CN)

(73) Assignee: Hubei Yangtze Industrial Innovation Center of Advanced Display Co., Ltd., Wuhan (CN)

( * ) Notice: Subject to any disclaimer, the term of this patent is extended or adjusted under 35 U.S.C. 154(b) by 0 days.

(21) Appl. No.: 18/359,379

(22) Filed: Jul. 26, 2023

(65) Prior Publication Data
US 2023/0380212 A1    Nov. 23, 2023

Related U.S. Application Data

(63) Continuation of application No. 16/912,552, filed on Jun. 25, 2020, now Pat. No. 11,744,105.

(30) Foreign Application Priority Data

May 6, 2020    (CN) .......................... 202010374758.7

(51) Int. Cl.
H10K 50/858    (2023.01)
H01L 25/075    (2006.01)
(Continued)

(52) U.S. Cl.
CPC ....... *H10K 50/858* (2023.02); *H01L 25/0753* (2013.01); *H10K 50/844* (2023.02);
(Continued)

(58) Field of Classification Search
None
See application file for complete search history.

(56) References Cited

U.S. PATENT DOCUMENTS

| | | |
|---|---|---|
| 2016/0064694 A1 | 3/2016 | Choi et al. |
| 2020/0119113 A1 | 4/2020 | Lee et al. |
| | (Continued) | |

FOREIGN PATENT DOCUMENTS

| | | |
|---|---|---|
| CN | 102832227 A | 12/2012 |
| CN | 109192766 A | 1/2019 |
| CN | 110690363 A | 1/2020 |

OTHER PUBLICATIONS

First Chinese Office Action mailed Apr. 18, 2022, issued in corresponding Chinese Application No. 202010374758.7 filed May 6, 2020, and its English translation thereof, 11 pages.

*Primary Examiner* — Michelle Mandala
*Assistant Examiner* — Jordan M Klein
(74) *Attorney, Agent, or Firm* — Christensen O'Connor Johnson Kindness PLLC

(57) ABSTRACT

Provided is a display panel, including: a base substrate, a light emitting device layer provided on the base substrate and including light emitting devices, and a light adjustment structure layer provided at a side of the light emitting device layer facing away from the base substrate and including light adjustment units and a dielectric layer covering the light adjustment units. Each light adjustment unit has a smaller refractive index than the dielectric layer and includes a light adjustment sub-section and a through hole penetrating the light adjustment unit in a direction perpendicular to the base substrate. The through hole overlaps one light emitting device, and the light adjustment sub-section surrounds the through hole. For one light adjustment unit, a thickness of (Continued)

the light adjustment sub-section gradually increases in a direction from the through hole to the light adjustment sub-section.

12 Claims, 9 Drawing Sheets

(51) Int. Cl.
*H10K 50/844* (2023.01)
*H10K 59/12* (2023.01)
*H10K 59/35* (2023.01)
*H10K 59/40* (2023.01)

(52) U.S. Cl.
CPC ........... *H10K 59/352* (2023.02); *H10K 59/12* (2023.02); *H10K 59/40* (2023.02)

(56) References Cited

U.S. PATENT DOCUMENTS

2020/0227489 A1* 7/2020 Kim .................... H10K 50/856
2020/0350516 A1* 11/2020 An ...................... H10K 59/40

* cited by examiner

DISPLAY PANEL, MANUFACTURING METHOD THEREOF AND DISPLAY APPARATUS

CROSS-REFERENCE TO RELATED APPLICATIONS

This application is a continuation application of U.S. application Ser. No. 16/912,552, filed on Jun. 25, 2020, which claims priority to Chinese Patent Application No. 202010374758.7, filed on May 6, 2020. All of the aforementioned applications are hereby incorporated by reference in their entireties.

TECHNICAL FIELD

The present disclosure relates to the field of display technology, for example, to a display panel, a manufacturing method thereof and a display apparatus.

BACKGROUND

Currently mainstream display apparatuses include a liquid crystal display apparatus and an organic light emitting display apparatus. In the liquid crystal display apparatus, since liquid crystals do not emit light, it is needed to provide a backlight module that provides a light source for the liquid crystal display panel, so that the display apparatus has a relatively large overall thickness and a relatively large weight. In the organic light emitting display apparatus, an organic light emitting diode (OLED) is used as a light emitting device, which has characteristics of self-illumination and requires for no additional light source, which facilitates overall thinning and lightness of the display apparatus, thereby achieving manufacturing of a flexible display screen. In addition, the organic self-illumination display technology also has characteristics such as a fast response speed and a wide viewing angle. Therefore, the organic self-illumination display technology has become a focus of current research. However, in the current organic light emitting display technology, part of large-angle light emitted by the light emitting device is limited to an interior of the display panel and cannot exit the display panel to contribute to light emitting of pixels, which affects an overall light extraction efficiency of the light emitting device.

SUMMARY

An embodiment of the present disclosure provides a display panel, a manufacturing method thereof, and a display apparatus, to solve a technical problem of the low light extraction efficiency of the light emitting device, which would otherwise affect power consumption of the display panel.

In a first aspect, an embodiment of the present disclosure provides a display panel, including:
a base substrate;
a light emitting device layer provided on the base substrate and including a plurality of light emitting devices; and
a light adjustment structure layer provided at a side of the light emitting device layer facing away from the base substrate, wherein the light adjustment structure layer includes a plurality of light adjustment units and a dielectric layer covering the plurality of light adjustment units, each of the plurality of light adjustment units has a smaller refractive index than the dielectric layer, each of the plurality of light adjustment units includes a light adjustment sub-section and a through hole penetrating the light adjustment unit in a direction perpendicular to the base substrate, the through hole overlaps one of the plurality of light emitting devices, and the light adjustment sub-section surrounds the through hole.

For one of the plurality of light adjustment units, a thickness of the light adjustment sub-section gradually increases in a direction from the through hole to the light adjustment sub-section.

In a second aspect, an embodiment of the present disclosure further provides a display apparatus, including the display panel according to any embodiment of the present disclosure.

In a third aspect, an embodiment of the present disclosure also provides a manufacturing method of a display panel, and the manufacturing method includes:
providing a base substrate;
forming a light emitting device layer on the base substrate, the light emitting device layer including a plurality of light emitting devices;
forming a light adjustment structure layer at a side of the light emitting device layer facing away from the base substrate, wherein said forming light adjustment structure layer includes: forming a plurality of light adjustment unit precursors by using an inkjet printing process; and evaporating solvent to obtain a plurality of light adjustment units, wherein each of the light adjustment units includes a light adjustment sub-section and a through hole penetrating the light adjustment unit in a direction perpendicular to the base substrate, the through hole overlaps one of the plurality of light emitting devices, the light adjustment sub-section surrounds the through hole, and for one of the plurality of light adjustment units, a thickness of the light adjustment sub-section gradually increases in a direction from the through hole to the light adjustment sub-section; and
forming a dielectric layer on the plurality of light adjustment units, wherein each of the plurality of light adjustment units has a smaller refractive index than the dielectric layer.

BRIEF DESCRIPTION OF DRAWINGS

In order to illustrate technical solutions of embodiments of the present disclosure, the accompanying drawings used in the embodiments or the prior art are introduced hereinafter. Obviously, these drawings illustrate some embodiments of the present disclosure.

DESCRIPTION OF EMBODIMENTS

In order to better understand technical solutions of the present disclosure, the embodiments of the present disclosure will be described in details with reference to the drawings. It should be clear that the described embodiments are representative of the embodiments of the present disclosure rather than all of the embodiments.

The terms used in the embodiments of the present disclosure are representative for the purpose of describing specific embodiments, rather than limiting the present disclosure. The singular form "a", "an", "the" and "said" used in the embodiments and claims shall be interpreted as also including the plural form, unless indicated otherwise in the context.

Figure 1:
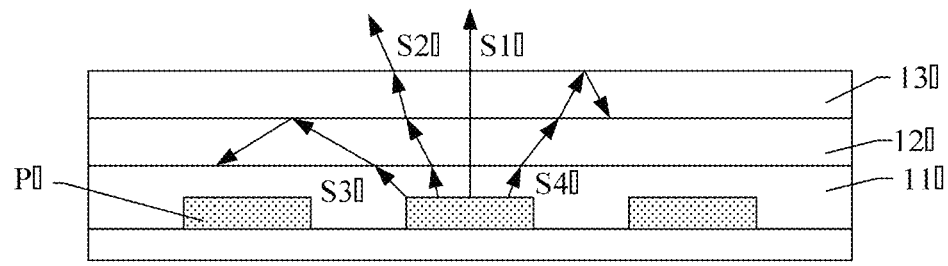
FIG. 1 is a cross-sectional schematic diagram of a display panel in the related art.

FIG. 1 illustrates a cross-sectional schematic diagram of a display panel in the related art. As shown in FIG. 1, in the related art, a plurality of film layers is provided on a light emitting device P', such as an encapsulation structure layer 11', an optical adhesive layer 12', a protective cover 13', etc. If respective film layers are made of different materials, then refractive indexes of the respective film layers are different. During display, the light emitting device P' emits light at a plurality of angles, and both light S1' and light S2' as shown in FIG. 1 can exit the display panel, to contribute to the light emitting of the pixels. However, since light S3' satisfies conditions of total reflection at interfaces of the film layers in the display panel, the light S3' is restricted inside the display panel after total reflection, and light S4' is totally reflected at an interface between the display panel and the air and thus restricted inside the display panel. That is, neither the light S3' nor the light S4' can exit the display panel, thereby affecting a light extraction efficiency of the light emitting device.

Based on the above problems, an embodiment of the present disclosure provides a display panel, a manufacturing method thereof and a display apparatus. By providing a light adjustment structure layer on the light emitting device layer, large-angle light emitted from the light emitting device can have a light path changed by a light adjustment unit in the light adjustment structure layer, so as to reduce an angle between a light propagation direction and a direction perpendicular to a base substrate, which is equivalent to reducing a light exiting angle of the large-angle light. Therefore, the large-angle light emitted from the light emitting device can also be emitted from the display panel to contribute to the light emission of the pixels, thereby improving the light extraction efficiency of the light emitting device and reducing power consumption of the display panel. In the following, implementations of the present disclosure will be explained in detail.

Figure 2:
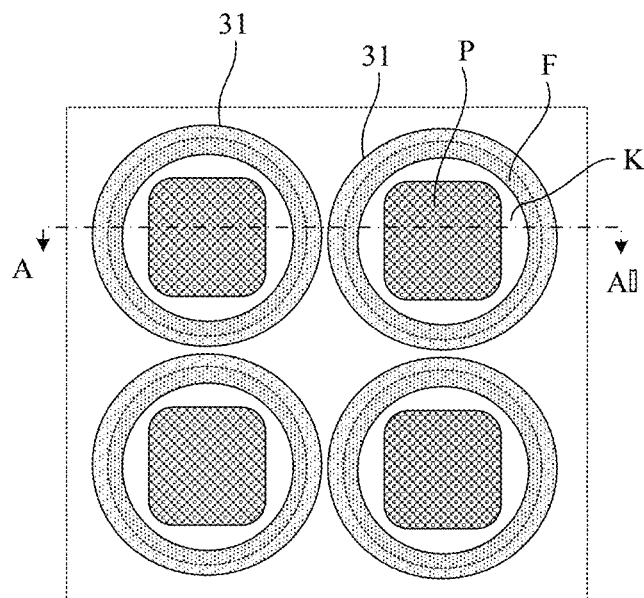
FIG. 2 is a schematic top view of a part of a display panel according to a representative embodiment of the present disclosure.
Figure 3:
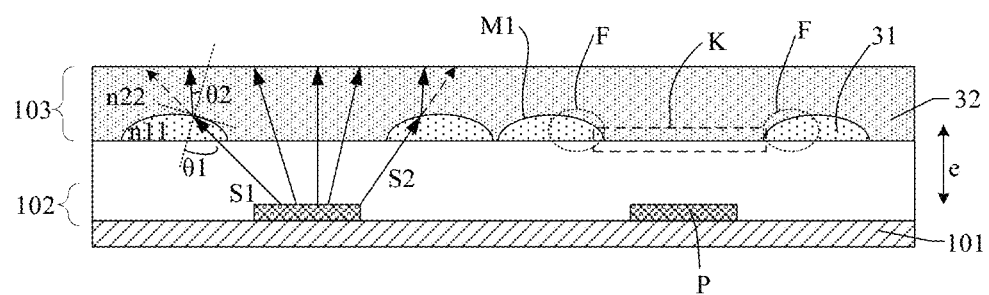
FIG. 3 is a cross-sectional schematic diagram at a position of a tangent line A-A' in FIG. 2.

FIG. 2 is a schematic top view of a part of a display panel according to an embodiment of the present disclosure, and FIG. 3 is a cross-sectional schematic diagram at a position of a tangent line A-A' in FIG. 2.

As shown in FIG. 3, the structure of the display panel is schematically illustrated. The display panel includes: a base substrate 101, a light emitting device layer 102, and a light adjustment structure layer 103. The light emitting device layer 102 is disposed on the base substrate 101, and the light emitting device layer 102 includes a plurality of light emitting devices P (two are shown in FIG. 3), each of which may be an organic light emitting device, a miniature diode, or the like. The light adjustment structure layer 103 is disposed at a side of the light emitting device layer 102 facing away from the base substrate 101, and the light adjustment structure layer 103 includes a plurality of light adjustment units 31 and a dielectric layer 32 covering the plurality of light adjustment units 31. The dielectric layer 32 may be one whole-layer continuous film layer structure or a patterned film layer, and may include a plurality of dielectric units, one of which covers one light adjustment unit 31. In FIG. 3, a case where the dielectric layer 32 is one whole-layer continuous film layer structure is illustrated. A refractive index n11 of the light adjustment unit 31 is smaller than a refractive index n22 of the dielectric layer 32. Referring to FIG. 2 and FIG. 3 in conjunction, each of the light adjustment units 31 includes a light adjustment sub-section F and a through hole K. The through hole K penetrates the light adjustment unit 31 in a direction e perpendicular to the base substrate (when the display panel is a flat-plate display panel, the direction e perpendicular to the base substrate is the same as a direction perpendicular to the display panel). The through hole K overlaps the light emitting device P, and the light adjustment sub-section F surrounds the through hole K. As shown in FIG. 3, for one light adjustment unit 31, in a direction from the through hole K to the light adjustment sub-section F, a thickness of the light adjustment sub-section F gradually increases, in such a manner that light emitted from the light emitting device P, after passing through the light adjustment sub-section F, is deflected towards an upward direction of the direction e.

In the embodiment of the present disclosure, the light adjustment structure layer 103 is provided on the light emitting device P, and the refractive index n11 of the light adjustment unit 31 in the light adjustment structure layer 103 is smaller than the refractive index n22 of the dielectric layer 32, so that refraction occurs when the light emitted from the light emitting device P is irradiated onto an interface (that is, on the interface) where the light adjustment unit 31 and the dielectric layer 32 are in contact with each other. As shown in a simplified light path diagram in FIG. 3, light S1 emitted by the light emitting device P is irradiated to the interface where the light adjustment unit 31 and the dielectric layer 32 are in contact with each other, an incidence angle of the light S1 is $\theta 1$, and a refraction angle after entering the dielectric layer 32 is $\theta 2$. According to a law of refraction, $n11*\sin \theta 1 = n22*\sin \theta 2$. Since $n11<n22$, then $\sin \theta 1 > \sin \theta 2$ and thus $\theta 1 > \theta 2$. That is, the incidence angle is larger than the refraction angle. After the light S1 is refracted at the interface between the light adjustment unit 31 and the dielectric layer 32, the angle between the propagation direction and the direction e becomes smaller, which is equivalent to reducing the light emission angle of the large-angle light emitted by the light emitting device P. Similarly, light S2 also has its light path changed after being refracted at the interface between the light adjustment unit 31 and the dielectric layer 32. In the display panel according to the embodiment of the present disclosure, the light adjustment structure layer can adjust the light path of the large-angle light emitted by the light emitting device, to reduce the angle between this part of the light and the direction perpendicular to the base substrate, so as to reduce a probability that this part of the light will be totally reflected at the interface between the film layers in the display panel or at the interface between the display panel and the air, which can improve the light emission efficiency of the light emitting device, thereby reducing the power consumption of the display panel.

With continued reference to FIG. 1, the dielectric layer 32 is a planarization layer. In the embodiment of the present disclosure, by providing the light adjustment structure layer on the light emitting device, the light path of the large-angle light emitted by the light emitting device can be adjusted, which reduces the angle between the light and the direction perpendicular to the display panel, lowers the probability that the light is totally reflected in the display panel and restricted in the display panel, and improves the light emission efficiency of the light emitting device. In addition, the dielectric layer is a planarization layer, and the whole-layer planarization layer manufactured during manufacturing can cover all the light adjustment units, so that there is no need to etch the dielectric layer. Moreover, the planarization layer can provide a flattening surface for the light adjustment structure layer, which is beneficial to flatness of the light emitting surface side of the display panel.

Specifically, the interface between the light adjustment sub-section and the dielectric layer is an arc-shaped surface, which may be either a convex surface protruding from the light emitting device layer along a direction facing away from the base substrate or a concave surface formed by the light adjustment sub-section recessing towards to the light emitting device layer. The interface between the light adjustment sub-section and the dielectric layer is an arc-shaped surface, then normal directions corresponding to different parts of the arc-shaped surface are different, so that when the light of the same angle emitted by the light emitting device is irradiated to different parts of the arc-shaped surface, the light propagates in different directions after being refracted. After the large-angle light emitted by the light emitting device is refracted at the interface between the light adjustment sub-section and the dielectric layer, the light can also propagate in many different directions while having the propagation direction of the light changed, so as to ensure that the light is uniformly diverged and emitted while improving the light emission efficiency of the light emitting device.

As shown in FIG. 3, the interface between the light adjustment sub-section F and the dielectric layer 32 is a convex surface that protrudes from the light emitting device layer 102 along a direction facing away from the base substrate 101.

Figure 4:
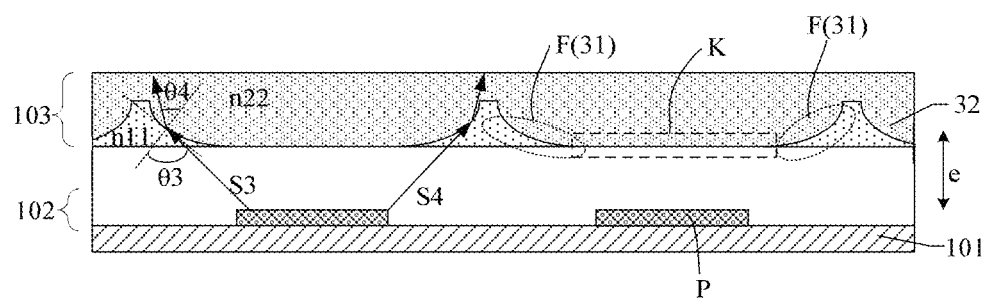
FIG. 4 is another cross-sectional schematic diagram of a display panel according to a representative embodiment of the present disclosure.

In another embodiment, as shown in FIG. 4, which illustrates another cross-sectional schematic diagram of a display panel according to an embodiment of the present disclosure, the interface between the light adjustment sub-section F and the dielectric layer 32 is a concave surface. The drawing illustrates the light S3 and the light S4 emitted from the light emitting device P at relatively large angles. Taking the light S3 as an example, the incidence angle at the interface between the light adjustment sub-section F and the dielectric layer 32 is $\theta 3$, and the refraction angle after entering the dielectric layer 32 is $\theta 4$. According to the law of refraction, $n11*\sin \theta 3 = n22*\sin \theta 4$. Since $n11<n22$, then $\sin \theta 3 > \sin \theta 4$, and thus $\theta 3 > \theta 4$. That is, the angle between the propagation direction and the direction e becomes smaller after the light S3 is refracted at the interface between the light adjustment sub-section F and the dielectric layer 32, thereby reducing the probability that the light will be totally reflected in the display panel and thus restricted in the display panel.

As an example, the interface between the light adjustment sub-section and the dielectric layer can also be a slope surface. That is, in the cross-sectional schematic diagram, the interface between the light adjustment sub-section and the dielectric layer is substantially a straight line.

In an embodiment, an orthographic projection of the light adjustment unit 31 on the base substrate 101 has a ring shape. With continued reference to the top view shown in FIG. 2, the orthographic projection of the light adjustment unit 31 on the base substrate 101 is obtained along a plan viewing direction. Then, in a top view, the light adjustment unit 31 coincides with the orthographic projection (not labelled in the drawing) of the light adjustment unit 31 on the base substrate 101, and it can be seen that the light adjustment unit 31 has a ring shape in the top view. With continued reference to the illustration in FIG. 3, the light adjustment unit 31 includes a first surface M1 facing away from the base substrate 101, and the first surface M1 protrudes along a direction facing away from the base substrate 101. In this embodiment, the light adjustment unit 31 corresponds to a ring-shaped convex lens structure. The ring-shaped convex lens has a through hole in a center, and the through hole overlaps the light emitting device. An inner part of the ring-shaped convex lens is the light adjustment sub-section. The relatively large-angle light emitted from the light emitting device is refracted at the interface between the ring-shaped convex lens and the dielectric layer after being emitted to the inner part of the ring-shaped convex lens, and the angle between the propagation direction of the light and the direction perpendicular to the display panel becomes smaller after the refraction, so that the probability that the part of the light is totally reflected inside the display panel is lowered, thereby improving the light emission efficiency of the light emitting device. When manufacturing, the light adjustment unit may be manufactured by an inkjet printing process, in which ink droplets are sprayed at a corresponding position of each light adjustment unit, an evaporation amount of solvent at an edge of the ink droplet is much larger than an amount of loss of a liquid volume thereof, so the solvent is replenished from a central region to an edge, so as to form a capillary flow from inside to outside to make solute in the ink gather at the edge; the solute in the ink is the manufacturing material of the light adjustment unit, and after the solvent is evaporated, a light adjustment unit having through holes is formed; and then a dielectric layer is formed on the plurality of light adjustment units. A representative specific manufacturing method will be described in detail in following embodiments of the manufacturing method.

Figure 5:
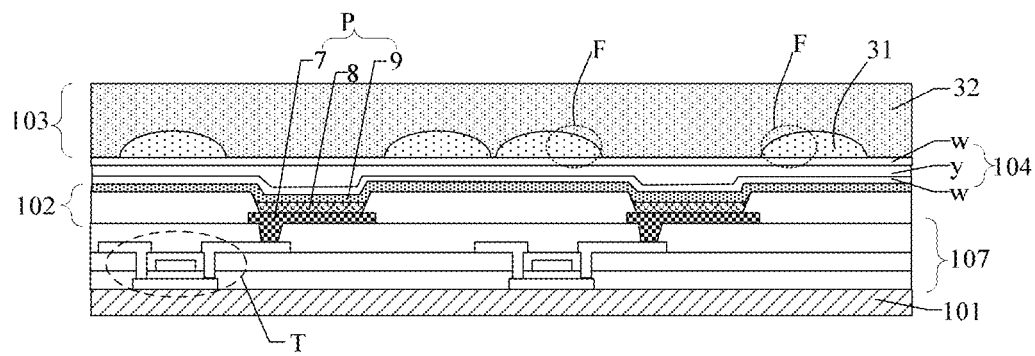
FIG. 5 is another cross-sectional schematic diagram of a display panel according to a representative embodiment of the present disclosure.

In FIG. 2, a case where the orthographic projection of the light adjustment unit 31 on the base substrate 101 is a circular ring is illustrated, while in another embodiment, the orthographic projection of the light adjustment unit 31 on the base substrate 101 may also be a rectangular ring. In another embodiment, the shape of the light adjustment unit 31 is substantially the same as a shape of an outer edge of the light emitting device P in a top view. In one embodiment, FIG. 5 illustrates another cross-sectional schematic diagram of a display panel according to an embodiment of the present disclosure. As shown in FIG. 5, an array layer 107 is further included on the base substrate 101, and the array layer 107 includes a plurality of thin-film transistors T. In the drawing, the thin-film transistor T of a top gate structure is used for illustration. Alternatively, the thin-film transistor may be of a bottom gate structure. The light emitting device P in the light emitting device layer 102 includes an anode 7, a light emitting layer 8 and a cathode 9 that are sequentially stacked, and the thin-film transistor T is connected to the anode 7. An encapsulation layer 104 is further provided on the light emitting device layer 102, and the encapsulation layer 104 includes two inorganic encapsulation layers w and one organic encapsulation layer y. The organic encapsulation layer y is located between the two inorganic encapsulation layers w. A light emitting material in the light emitting layer 8 is sensitive to water and oxygen, and the encapsulation layer 104 can play a role in encapsulating and protecting the light emitting device, to prevent damage by the water and oxygen and guarantee a service life of the light emitting device P. In the encapsulation layer 104, the inorganic encapsulation layer w has high compactness and can well block water and oxygen molecules, and organic molecules in the organic encapsulation layer y have good flexibility and can help the inorganic encapsulation layer w release stress, so as to prevent the inorganic encapsulation layer w from cracking. The light adjustment structure layer 103 is located at a side of the encapsulation layer 104 facing away from the light emitting device layer 102.

Figure 6:
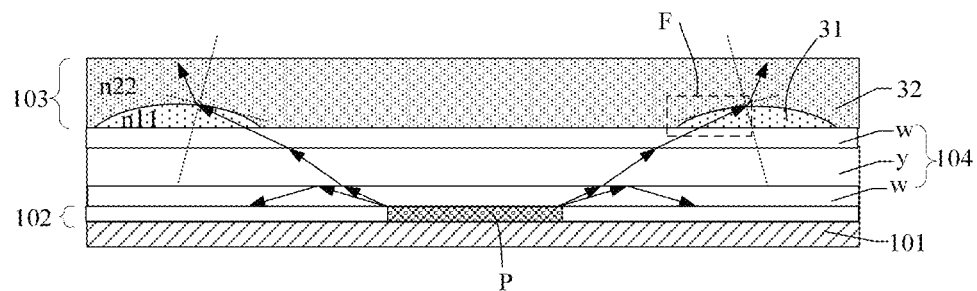
FIG. 6 is another cross-sectional schematic diagram of a display panel according to a representative embodiment of the present disclosure.

In an embodiment, FIG. 6 illustrates another cross-sectional schematic diagram of a display panel according to an embodiment of the present disclosure. As shown in FIG. 6, the display panel includes an encapsulation layer 104 located between the light emitting device layer 102 and the light adjustment structure layer 103. The light emitting device P is schematically illustrated in the drawing. The encapsulation layer 104 includes at least one inorganic encapsulation layer w (two layers are shown in the drawing) and at least one organic encapsulation layer y (one layer is shown in the drawing). In the encapsulation layer 104, the inorganic encapsulation layer w and the organic encapsulation layer y are alternately stacked, and refractive indexes of the inorganic encapsulating layer w and the organic encapsulating layer y are different. Generally, the refractive index of the organic encapsulating layer y is smaller than the refractive index of the inorganic encapsulating layer w. Then, after the light emitted by the light emitting device P enters the encapsulation layer 104, some large-angle light will be totally reflected at an interface between the organic encapsulation layer y and the inorganic encapsulation layer w (the simplified light path diagram shown in the drawing) and thus can no longer exit the display panel, which has a certain affection on the light emission efficiency of the light emitting device. However, according to the present disclosure, the light adjustment structure layer is provided at the side of the encapsulation layer facing away from the light emitting device layer, the light emitted by the light emitting device first enters the encapsulation layer and then exits from the encapsulation layer and then enters the light adjustment structure layer, and the light adjustment structure layer can adjust the propagation direction of at least some of the large-angle light entering therein, to prevent more large-angle light from being totally reflected in the display panel and unable to exit the display panel, so as to lower the probability of total reflection of the light in the display panel and improve the light emission efficiency of the light emitting device.

Figure 7:
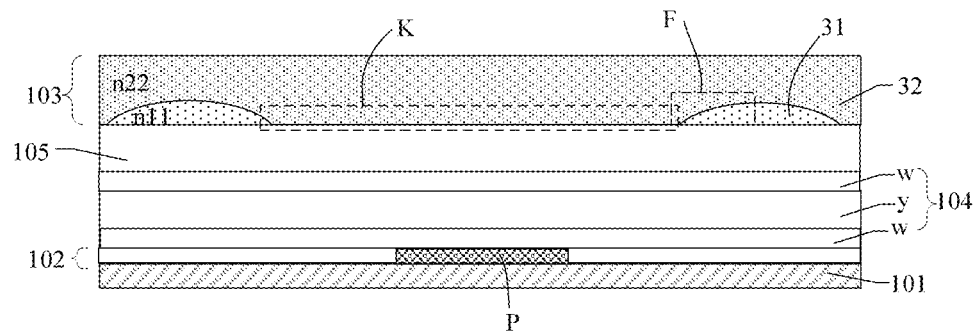
FIG. 7 is another cross-sectional schematic diagram of a display panel according to a representative embodiment of the present disclosure.

Further, in some embodiments, the display panel further includes a touch film group layer. As shown in FIG. 7, which illustrates another cross-sectional schematic diagram of a display panel according to an embodiment of the present disclosure, the display panel includes an encapsulation layer 104 and a touch film group layer 105. Both the encapsulation layer 104 and the touch film group layer 105 are located between the light emitting device layer 102 and the light adjustment structure layer 103. The encapsulation layer 104 is located at a side of the touch film group layer 105 close to the light emitting device layer 102, and includes at least one inorganic encapsulation layer w (two layers are shown in the drawing) and at least one organic encapsulation layer y (one layer is shown in the drawing). The touch film group layer in the drawing is a simplified illustration. Alternatively, the touch film group layer may include an electrode array composed of a plurality of block-shaped touch electrodes. In the electrode array, a plurality of block-shaped touch electrodes are arranged in a row direction to form an electrode row, and a plurality of block-shaped touch electrodes are arranged in a column direction to form an electrode column. Any two adjacent block-shaped touch electrodes in one electrode row are electrically connected, and any two adjacent block-shaped touch electrodes in one electrode column are electrically connected. An embodiment of the present disclosure provides a display panel having a touch function, and a touch film group layer is formed on the encapsulation layer. A thickness of the touch film group layer is relatively thin, which is conducive to reduction of the overall thickness of the panel compared with an aspect where a touch film group is bonded to the display panel. In addition, providing the light adjustment structure layer at the side of the touch film group layer facing away from the light emitting device layer can adjust the light path of the light that is emitted by the light emitting device and still has a relatively large light emission angle after passing through the touch film group layer, to reduce the probability of total reflection of light in the display panel and improve the light emission efficiency of the light emitting device.

In one embodiment, with continued reference to FIG. 2, two adjacent light adjustment units 31 are independent of each other. In the direction perpendicular to the base substrate 101, the light emitting device P overlaps the through hole K of the light adjustment unit 31, that is, one light emitting device P corresponds to one light adjustment unit 31. By setting two adjacent light adjustment units 31 independently of each other, the light adjustment sub-section in each light adjustment unit can adjust large-angle light emitted by the light emitting unit corresponding thereto, to avoid interference of light adjustment between adjacent light adjustment units.

Figure 8:
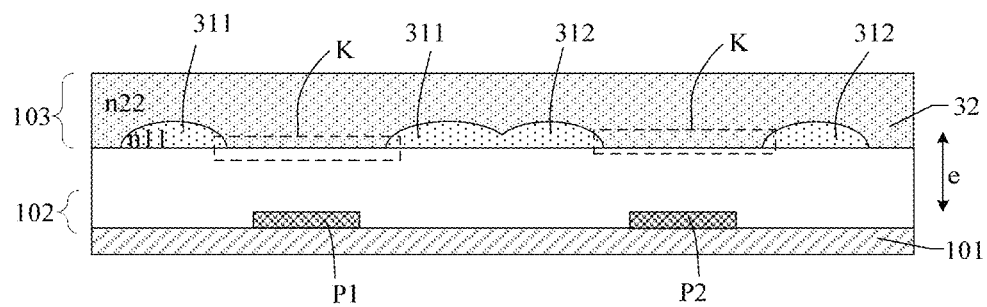
FIG. 8 is another cross-sectional schematic diagram of a display panel according to a representative embodiment of the present disclosure.

In another embodiment, adjacent two light adjustment units of some light adjustment units are in contact with each other. FIG. 8 illustrates another cross-sectional schematic diagram of a display surface according to an embodiment of the present disclosure. As shown in FIG. 8, there are two adjacent light emitting devices P1 and P2, the light adjustment unit 311 corresponds to the light emitting device P1, the light adjustment unit 312 corresponds to the light emitting device P2, and the light adjustment unit 311 is in contact with the light adjustment unit 312. Due to a manufacturing process or limitations of a size of the light adjustment unit, some adjacent light adjustment units in the display panel are in contact with each other, as long as the through hole of the light adjustment unit overlaps the light emitting device, that is, for one light adjustment unit, as long as a thickness of the light adjustment sub-section surrounding the through hole gradually increases in the direction from the through hole towards the light adjustment sub-section.

In some implementations, the plurality of light emitting devices in the display panel according to the embodiment of the present disclosure includes a first light emitting device and a second light emitting device that emit light of different colors, and a light emitting area of the first light emitting device is larger than that of the second light emitting device. When the light emitting devices emit light of different colors, light emitting materials used in the light emitting devices are different, and correspondingly, light emitting efficiencies of the different light emitting materials are different. In the embodiments of the present disclosure, by adjusting a light emitting area of a light emitting device, an affection on the light emitting brightness by the light emission efficiency of the light emitting device is balanced. To be specific, a light emission efficiency of the first light emitting device is smaller than that of the second light emitting device, and the light emitting area of the first light emitting device is set to be larger than that of the second light emitting device, in order to achieve that the light emitting devices emitting light of different colors cooperate with each other to perform color display.

The plurality of light emitting devices includes a red light emitting device, a green light emitting device, and a blue light emitting device. In one embodiment, a light emitting area of the blue light emitting device is larger than that of the red light emitting device, a light emitting area of the blue light emitting device is larger than that of the green light emitting device, and a light emitting area of the green light emitting device is larger than that of the red light emitting device. In another embodiment, the light emitting area of the blue light emitting device is larger than that of the red light emitting device, the light emitting area of the blue light emitting device is larger than that of the green light emitting device, and the light emitting area of the green light emitting device is equal to that of the red light emitting device. Since a difference between the light emission efficiency of the green light emitting device and the light emission efficiency of the red light emitting device is relatively small, setting the light emitting areas of the green light emitting device and the red light emitting device to be equal has little effect on the display effect, while a difference between the light emission efficiency of the blue light emitting device and the light emission efficiencies of the red light emitting device and the green light emitting device is relatively large, so a differential design is made to the light emitting area of the blue light emitting device.

Figure 9:
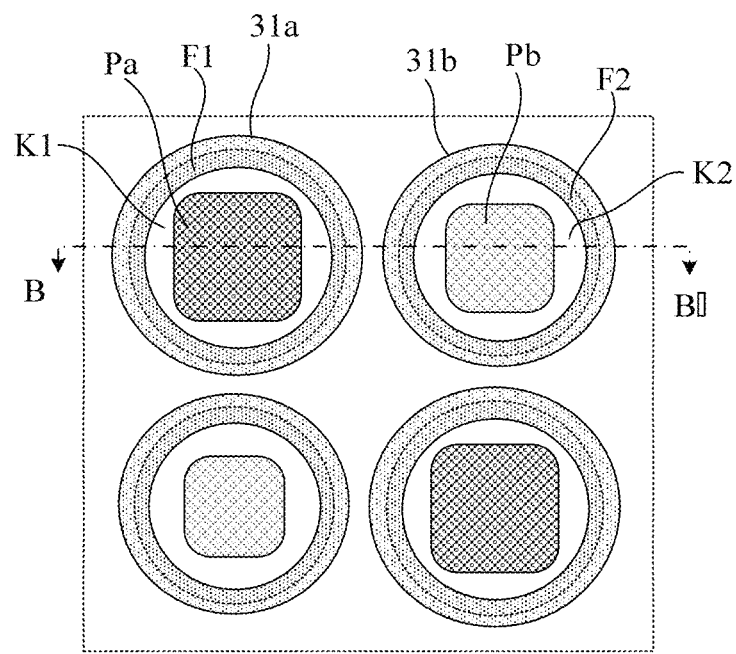
FIG. 9 is a schematic top diagram of a part of a display panel according to a representative embodiment of the present disclosure.
Figure 10:
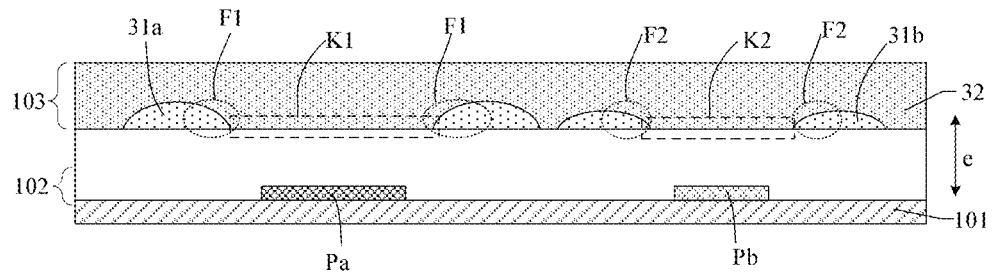
FIG. 10 is a cross-sectional schematic diagram at a position of a tangent line BB' in FIG. 9.
Figure 11:
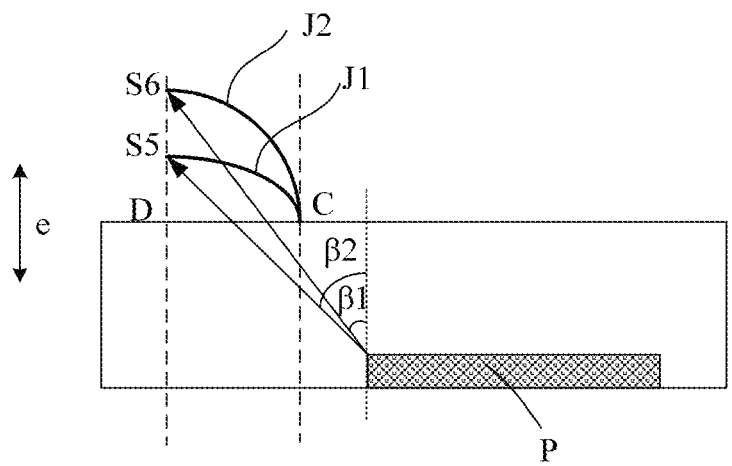
FIG. 11 is a schematic diagram of a principle of the embodiment corresponding to FIG. 10.

In an embodiment, FIG. 9 illustrates another schematic top diagram of a part of a display panel according to an embodiment of the present disclosure, FIG. 10 illustrates a cross-sectional schematic diagram at the position of the tangent line BB' in FIG. 9, and FIG. 11 illustrates a schematic diagram of the principle of the corresponding embodiment in FIG. 10.

As shown in FIG. 9, a first light emitting device Pa and a second light emitting device Pb emitting light of different colors are shown, a light emitting area of the first light emitting device Pa is larger than that of the second light emitting device Pb, the plurality of light adjustment units includes a first light adjustment unit 31a and a second light adjustment unit 31b, the first light adjustment unit 31a includes a first through hole K1 and a first light adjustment sub-section F1 surrounding the first through hole K1, and the second light adjustment unit 31b includes a second through hole K2 and a second light adjustment sub-section F2 surrounding the second through hole K2. The first light emitting device Pa overlaps the first through hole K1, and the second light emitting device Pb overlaps the second through hole K2. That is, the first light emitting device Pa corresponds to the first light adjustment unit 31a, and the second light emitting device Pb corresponds to the second light adjustment unit 31b.

As shown in FIG. 10, for one first light adjustment unit 31a, in a direction from the first through hole K1 to the first light adjustment sub-section F1, a thickness change rate of the first light adjustment sub-section F1 is $\gamma 1$, and for one second light adjustment unit 31b, in a direction from the second through hole K2 to the second light adjustment sub-section F2, a thickness change rate of the second light adjustment sub-section F2 is $\gamma 2$, where $\gamma 2 > \gamma 1$. The thickness change rate is understood to be a ratio of an amount of change in the thickness of the light adjustment sub-section to an amount of change in the length of the light adjustment sub-section. The amount of increase in the length of the light adjustment sub-section is the amount of change in the length of the light adjustment sub-section in the direction from the first through hole to the first light adjustment sub-section in the cross-sectional diagram, and the amount of change in the thickness of the light adjustment sub-section is the amount of change in the thickness of the light adjustment sub-section in the direction e in the cross-sectional diagram.

As shown in the simplified schematic diagram in FIG. 11, J1 and J2 represent two light adjustment sub-sections having different thickness change rates. In the cross-sectional diagram, at positions from a point C to a point D in the drawing, the thickness change rate of the light adjustment sub-section J2 is larger than the thickness change rate of the light adjustment sub-section J1, with a line passing through the point D and parallel to the direction e (that is, the direction perpendicular to the base substrate) as a boundary. Light S5 emitted from the light emitting device P is emitted to an intersection of the light adjustment sub-section J1 and the boundary, and the light S5 can be refracted at an interface between the light adjustment sub-section J1 and the dielectric layer to change the light path. Light S6 emitted by the light emitting device P is emitted to an intersection of the light adjustment sub-section J2 and the boundary, and the light S6 can be refracted at an interface between the light adjustment sub-section J2 and the dielectric layer to change the light path. An angle between the light S5 and the direction e is β2, and an angle between the light S6 and the direction e is β1, where β1<β2. That is, the light adjustment sub-section J2 cannot play a role of changing the light path of the light S5, and the relatively large-angle light emitted by the light emitting device P is more likely to be changed in the light path by the light adjustment sub-section having a relatively small thickness change rate. Therefore, in the embodiment of the present disclosure, it is set γ2>γ1, and the first light adjustment sub-section can change the light path for more large-angle light compared with the second light adjustment sub-section, that is, the first light adjustment sub-section has a more obvious effect on improving the light emission efficiency of the light emitting device compared with the second light adjustment sub-section. The first light adjustment sub-section corresponds to the first light emitting device having a relatively large light emitting area, and the difference in light emission efficiency between the first light emitting device and the second light emitting device can be further balanced, thereby improving the display effect of the display panel.

Figure 12:
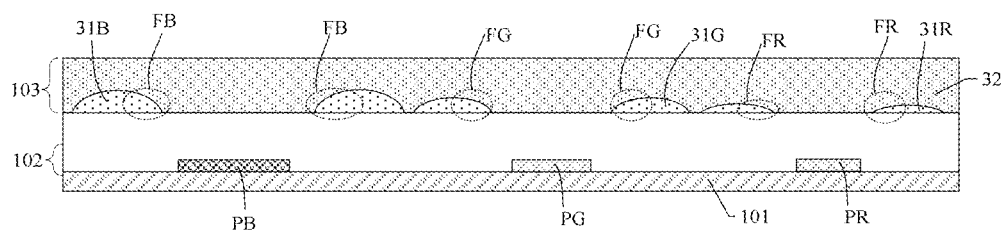
FIG. 12 is another cross-sectional schematic diagram of a display panel according to a representative embodiment of the present disclosure.

Specifically, in one embodiment, the light emitting area of the blue light emitting device>the light emitting area of the green light emitting device>the light emitting area of the red light emitting device. FIG. 12 illustrates another cross-sectional schematic diagram of a display panel according to an embodiment of the present disclosure. As shown in FIG. 12, a blue light emitting device PB corresponds to a light adjustment unit 31B, and the light adjustment unit 31B includes a light adjustment sub-section FB; a green light emitting device PG corresponds to a light adjustment unit 31G, and the light adjustment unit 31G includes a light adjustment sub-section FG; and a red light emitting device PR corresponds to a light adjustment unit 31R, and the light adjustment unit 31R includes a light adjustment sub-section FR. For one light adjustment unit, in a direction from the through hole to the light adjustment sub-section, a thickness change rate of the light adjustment sub-section FB is the smallest, and a thickness change rate of the light adjustment sub-section FR is the largest. Therefore, among the light adjustment sub-sections corresponding to the light emitting devices of three colors, the light adjustment sub-section FB can change the light path of the more large-angle light, the light adjustment sub-section FB has the greatest effect on improving the light emission efficiency of the blue light emitting device PB, the light adjustment sub-section FR has the smallest effect on improving the light emission efficiency of the red light emitting device PR, and the light adjustment sub-section FG has a medium role in improving the light emission efficiency of the green light emitting device PG. Through performing different designs on the light adjustment sub-sections corresponding to the light emitting devices having three colors, the difference in light emission efficiency between different light emitting devices can also be balanced while ensuring the improvement of the light emission efficiency of the light emitting device of each color, so as to improve the display effect of the display panel.

In another embodiment, the light emitting area of the green light emitting device and the light emitting area of the red light emitting device are the same, and both are smaller than the light emitting area of the blue light emitting device. For one light adjustment unit, in the direction from the through hole to the light adjustment sub-section, the thickness change rate of the light adjustment sub-section corresponding to the green light emitting device is equal to the thickness change rate of the light adjustment sub-section corresponding to the red light emitting device, and both are larger than the thickness change rate of the light adjustment sub-section corresponding to the blue light emitting device. The light emission efficiency of the blue light emitting device is quite different from that of the red and green light emitting devices, and in this embodiment, differential designs are made to the light emitting area of the blue light emitting device and the corresponding light adjustment sub-section.

Figure 13:
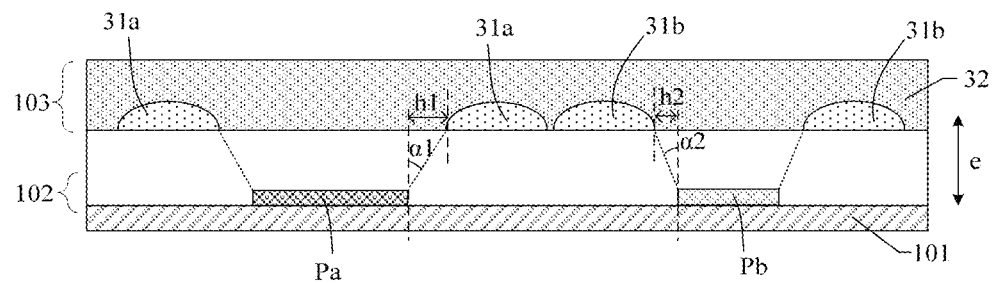
FIG. 13 is another cross-sectional schematic diagram of a display panel according to a representative embodiment of the present disclosure.
Figure 14:
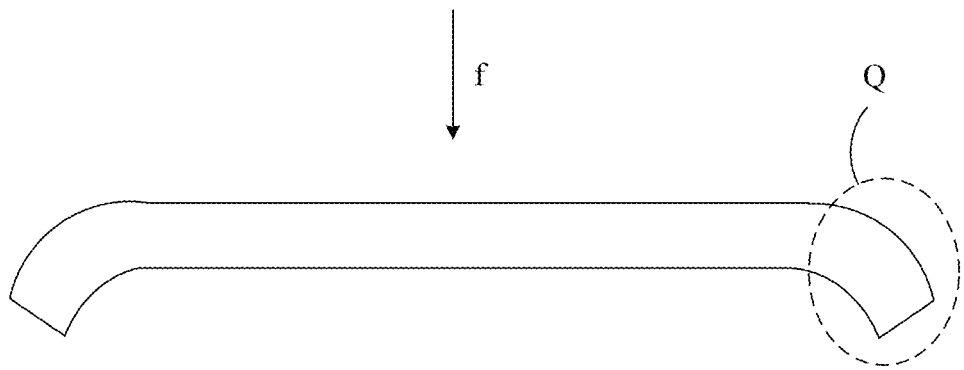
FIG. 14 is another simplified cross-sectional diagram of a display panel according to a representative embodiment of the present disclosure.

FIG. 13 illustrates another cross-sectional schematic diagram of a display panel according to an embodiment of the present disclosure. FIG. 14 illustrates another simplified cross-sectional diagram of a display panel according to an embodiment of the present disclosure. As shown in FIG. 13, the first light adjustment unit 31a corresponds to the first light emitting device Pa, the second light adjustment unit 31b corresponds to the second light emitting device Pb, the first light emitting device Pa and the second light emitting device Pb emit light of different colors, and the light emitting area of the first light emitting device Pa is larger than that of the second light emitting device Pb. The minimum distance from an inner side of the first light adjustment unit 31a to an outer edge of the first light emitting device Pa is a first distance h1, the minimum distance from an inner side of the second light adjustment unit 31b to an outer edge of the second light emitting device Pb is a second distance h2, and the first distance h1 is larger than the second distance h2. The first light emitting device Pa and the second light emitting device Pb are substantially at the same plane height, and the first light adjustment unit 31a and the second light adjustment unit 31b are also basically at the same plane height, so that as illustrated in the drawing, in the cross-sectional diagram, a horizontal distance from the inner side of the first light adjustment unit 31a to the outer edge of the first light emitting device Pa is h1, a horizontal distance from the inner side of the second light adjustment unit 31b to the outer edge of the second light emitting device Pb is h2, light that is emitted from the edge of the first light emitting device Pa (e.g., only such light) and has a light emission angle larger than a1 can be adjusted by the first light adjustment unit to change the light path, and light that is emitted from the edge of the second light emitting device Pb (e.g., only such light) and has a light emission angle larger than α2 can be adjusted by the second light adjustment unit to change the light path, where h1>h2 and thus α1>α2. Compared with the first light adjustment unit 31a, the second light adjustment unit 31b can adjust the light path for more light emitted by the second light emitting device Pb. That is, after the light path is changed at the interface between the second light adjustment unit 31b and the dielectric layer, more light emitted by the second light emitting device Pb approaches the second light emitting device PB, so that an amount of the increase in the light emission efficiency of the second light emitting device is larger than an amount of the increase in the light emission efficiency of the first light emitting device.

This embodiment can be applied to a display panel having an arc-shaped side surface. As shown in FIG. 14, the display panel having the arc-shaped side surface (a position Q in the drawing) is simply illustrated, and a specific structure is not shown. Since the side of the display panel is bent, light emitted by the bent portion during the light emitting period will be shifted relative to a front viewing direction f of the display panel. Herein, the front viewing direction f is understood as the direction in which a user's eyes look towards the display panel when the user is using the display panel. When the user views the arc-shaped side surface (the Q position) in the front viewing direction f, there is a color shift phenomenon, which affects the display effect. This is caused by different degrees of attenuation of light emitted by light emitting devices of different colors in a display region of the arc-shaped side surface. According to the embodiment of FIG. 13, in the display region of the arc-shaped side surface, different designs are made to the light adjustment units corresponding to the light emitting devices of different colors, and a difference in amounts of the increase in light emission efficiency of the light emitting devices of different colors is adjusted to balance the difference in the degrees of attenuation of light emitted by the light emitting devices of different colors, the color shift of the arc-shaped side surface can be improved, and the display effect can be improved.

Specifically, in the display region of the arc-shaped side surface, a minimum distance from the inner side of the light adjustment unit corresponding to the blue light emitting device to the outer edge of the blue light emitting device is $h3$, a minimum distance from the inner side of the light adjustment unit corresponding to the green light emitting device to the outer edge of the green light emitting device is $h4$, and a minimum distance from the inner side of the light adjustment unit corresponding to the red light emitting device to the outer edge of the red light emitting device is $h5$. In one embodiment, $h3>h4>h5$. In another embodiment, $h3>h4=h5$.

In an embodiment, the first light emitting device and the second light emitting device emit light of different colors, and the light emitting area of the first light emitting device is larger than the light emitting area of the second light emitting device. An area of the through hole overlapping the first light emitting device is a first area, an area of the through hole overlapping the second light emitting device is a second area, and the first area is larger than the second area. The area of the through hole overlapping the light emitting device may be designed based on a difference in the light emitting area, and the larger light emitting area of the light emitting device leads to the larger area of the through hole overlapping the light emitting device. In this way, the size of the through hole of the light adjustment unit may be designed so as to adapt to the light emitting area of the light emitting device, which can ensure that the light adjustment structure layer adjusts (e.g., only adjusts) the light path of the relatively large-angle light emitted by the light emitting device without changing the light path of the relatively small-angle light emitted by the light emitting device, thereby avoiding adverse effects caused by adjusting the light path of the relatively small-angle light.

Figure 15:
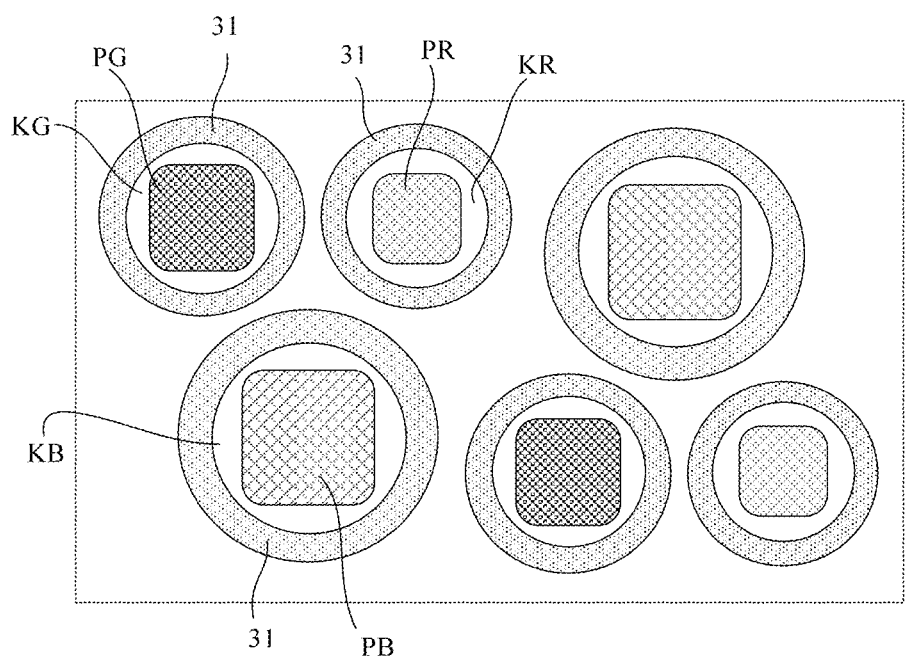
FIG. 15 is another schematic top diagram of a display panel according to a representative embodiment of the present disclosure.

FIG. 15 illustrates another schematic top diagram of a display panel according to an embodiment of the present disclosure. As shown in FIG. 15, the plurality of light emitting devices includes a red light emitting device, a green light emitting device and a blue light emitting device, and a light emitting area of the blue light emitting device PB>a light emitting area of the green light emitting device PG>a light emitting area of the red light emitting device PR. The through hole KB overlaps the blue light emitting device PB, the through hole KG overlaps the green light emitting device PG, the through hole KR overlaps the red light emitting device PR, and an area of the through hole KB>an area of the through hole KG>an area of the through hole KR. It may be designed that the areas of the corresponding through holes of the light emitting devices of different colors are different, in order to ensure that a part of large-angle light emitted by each of light emitting devices of different colors can have its light path changed after action of the light adjustment structure layer, thereby improving the light emission efficiency of each of the light emitting devices of different colors.

In another embodiment, the light emitting area of the green light emitting device and the light emitting area of the red light emitting device are the same and are both smaller than the light emitting area of the blue light emitting device, the area of the through hole overlapping the blue light emitting device is larger than the area of the through hole overlapping the green light emitting device, the area of the through hole overlapping the blue light emitting device is larger than the area of the through hole overlapping the red light emitting device, and the area of the through hole overlapping the red light emitting device is equal to the area of the through hole overlapping the green light emitting device. These will not be illustrated in the drawings again.

Figure 16:
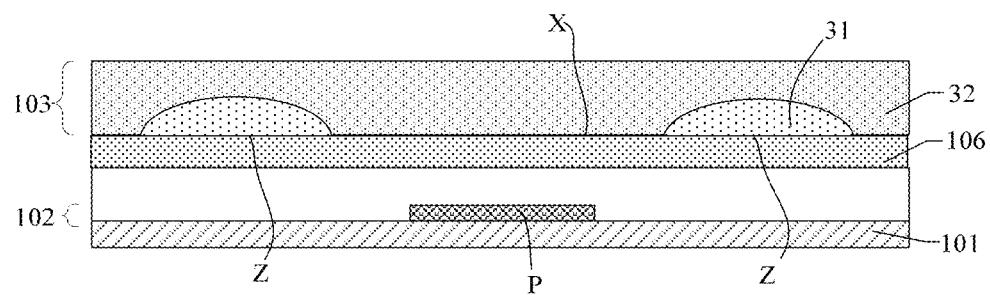
FIG. 16 is another cross-sectional schematic diagram of a display panel according to a representative embodiment of the present disclosure.

FIG. 16 illustrates another cross-sectional schematic diagram of a display panel according to an embodiment of the present disclosure. As shown in FIG. 16, the display panel further includes a contact layer 106 located between the light emitting device layer 102 and the light adjustment structure layer 103. A surface on a side of the contact layer 106 facing away from the base substrate 101 includes a plurality of central regions X and a peripheral region Z surrounding the central regions X, the light adjustment unit 31 is in contact with the peripheral region Z, and the through hole K exposes the central region X. That is, a shape of the central region X is substantially the same as a shape of the through hole K, while a shape of the peripheral region Z is substantially the same as the shape of the light adjustment unit 31.

Specifically, in one embodiment, the central region X has a smaller surface energy than the peripheral region Z. In this embodiment, the light adjustment unit in the light adjustment structure layer can be manufactured using the inkjet printing process. During the manufacturing process, first, a surface of the contact layer facing away from the base substrate is pretreated, to form a plurality of central regions and a plurality of peripheral regions, and the surface energy of the central region is smaller than that of the peripheral region; then the inkjet printing process is used to spray ink droplets at a position corresponding to the light emitting device, the ink droplets cover the central regions and at least part of the peripheral regions, it is uneasy for the central region to be wetted by the ink droplets since the surface energy of the central region is smaller than that of the peripheral region, and it is more easily for the peripheral region to be wetted by the ink droplets than the central region; and during evaporation of solvent in the ink droplets, ink in the central region is more likely to gather towards the peripheral region, a light adjustment unit having a through hole is formed after the solvent is evaporated, and the through hole exposes the central region. A differential design of the surface energy of the central region and the surface energy of the peripheral region in the contact layer can play an auxiliary role in the process of manufacturing the light adjustment unit, and it is possible to manufacture the light adjustment unit having the through hole by the inkjet printing process with a single step. In addition, a difference between the surface energy of the central region and the peripheral region can be adjusted by adjusting pretreatment process parameters, so as to control an area of the through hole in the light adjustment unit.

Specifically, in another embodiment, the central region X has a smaller roughness than the peripheral region Z. In this embodiment, the light adjustment unit in the light adjustment structure layer can be manufactured using the inkjet printing process. During the manufacturing process, first, a surface of the contact layer facing away from the base substrate is pretreated, to form a plurality of central regions and a plurality of peripheral regions, and the roughness of the central region is smaller than that of the peripheral region; then the inkjet printing process is used to spray the ink droplets at the position corresponding to the light emitting device, the ink droplets cover the central regions and at least part of the peripheral regions, since the roughness of the central region is smaller than that of the peripheral region, that is, a surface of the central region is smoother than that of the peripheral region, it is uneasy for the central region to be wetted by the ink droplets, while it is more easily for the peripheral region to be wetted by the ink droplets; and during evaporation of the solvent in the ink droplets, ink in the central region is more likely to gather towards the peripheral region, a light adjustment unit having a through hole is formed after the solvent is evaporated, and the through hole exposes the central region. A differential design of the roughness of the central region and the roughness of the peripheral region in the contact layer can play an auxiliary role in the process of manufacturing the light adjustment unit, and it is possible to manufacture the light adjustment unit having the through hole by the inkjet printing process with a single step. In addition, a difference between the roughness of the central region and the peripheral region can be adjusted by adjusting pretreatment process parameters, so as to control the area of the through hole in the light adjustment unit. As an example, the contact layer is a nanocrystalline layer, in which a density of nanoparticles in the nanocrystalline layer in the central region is larger than a density of nanoparticles in the peripheral region.

Figure 17:
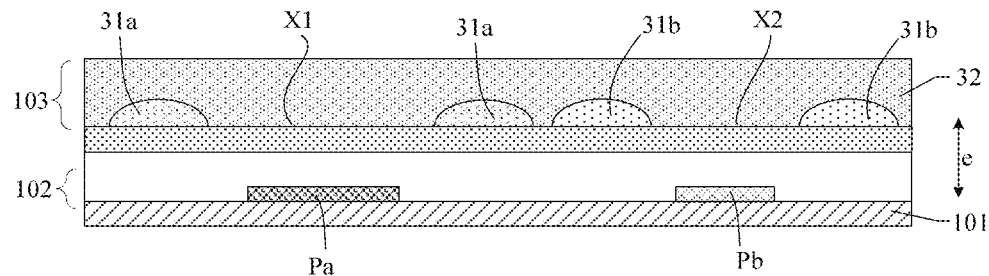
FIG. 17 is another cross-sectional schematic diagram of a display panel according to a representative embodiment of the present disclosure.

FIG. 17 illustrates another cross-sectional schematic diagram of a display panel according to an embodiment of the present disclosure. As shown in FIG. 17, the first light emitting device Pa and the second light emitting device Pb that emit light of different colors are shown, a light emitting area of the first light emitting device Pa is larger than that of the second light emitting device Pb, and the plurality of central regions includes a first central region X1 and a second central region X2. In the direction e perpendicular to the base substrate 101, the first central region X1 and the first light emitting device Pa overlap each other, and the second central region X2 and the second light emitting device Pb overlap each other.

In one embodiment, the first central region X1 has a smaller surface energy than the second central region X2. The smaller surface energy leads to that it is less likely to be wetted by the ink droplets when manufacturing the light adjustment unit by the inkjet printing process. Then, during the evaporation of the ink solvent during manufacturing, the ink on the first central region is more likely to gather towards the peripheral region than the ink on the second central region. In other words, more ink on the first central region gathers towards the peripheral region. Correspondingly, after the evaporation of the solvent is completed, the area of the through hole formed on the first central region is larger. By setting the surface energy of the central regions corresponding to the light emitting devices emitting light of different colors to be different, it is possible to manufacture, by means of the inkjet printing process, light adjustment units having through holes with different areas on the light emitting devices emitting light of different colors, so as to design the size of the through hole of the light adjustment unit to adapt to the light emitting area of the light emitting device. A differential design on the surface energy of the central regions corresponding to light emitting devices emitting light of different colors can play an auxiliary role in the manufacturing of the light adjustment unit.

Specifically, in an embodiment, the light emitting area of the blue light emitting device is larger than the light emitting area of the green light emitting device, and the light emitting area of the green light emitting device is larger than that of the red light emitting device; the surface energy of the central region overlapping the blue light emitting device is smaller than the surface energy of the central region overlapping the green light emitting device, and the surface energy of the central region overlapping the green light emitting device is smaller than the surface energy of the central region overlapping the red light emitting device.

In another embodiment, the light emitting area of the green light emitting device is the same as that of the red light emitting device, and both are smaller than the light emitting area of the blue light emitting device; the surface energy of the central region overlapping the blue light emitting device is smaller than the surface energy of the central region overlapping the green light emitting device, and the surface energy of the central region overlapping the green light emitting device is equal to the surface energy of the central region overlapping the red light emitting device.

In another embodiment, the roughness of the first central region X1 is smaller than the roughness of the second central region X2. The smaller the roughness, the less likely it is to be wetted by the ink droplets when manufacturing the light adjustment unit by the inkjet printing process. Then, during the evaporation of the ink solvent during manufacturing, the ink on the first central region is more likely to gather towards the peripheral region with respect to the ink on the second central region. In other words, the more ink on the first central region gathers towards the peripheral region. Correspondingly, after the evaporation of the solvent is completed, the area of the through hole formed on the first central region is larger. By setting the surface energy of the central regions corresponding to the light emitting devices emitting light of different colors to be different, it is possible to manufacture, by means of the inkjet printing process, a light adjustment unit having through holes with different areas on the light emitting devices emitting light of different colors, so as to design the size of the through hole of the light adjustment unit to adapt to the light emitting area of the light emitting device. A differential design on the roughness of the central regions corresponding to light emitting devices emitting light of different colors can assist the manufacturing of the light adjustment unit.

Specifically, in an embodiment, the light emitting area of the blue light emitting device is larger than the light emitting area of the green light emitting device, and the light emitting area of the green light emitting device is larger than that of the red light emitting device; the roughness of the central region overlapping the blue light emitting device is smaller than the roughness of the central region overlapping the green light emitting device, and the roughness of the central region overlapping the green light emitting device is smaller than the roughness of the central region overlapping the red light emitting device.

In another embodiment, the light emitting area of the green light emitting device is the same as the light emitting area of the red light emitting device, and both are smaller than the light emitting area of the blue light emitting device; the roughness of the central region overlapping the blue light emitting device is smaller than the roughness of the central region overlapping the green light emitting device, and the roughness of the central region overlapping the green light emitting device is equal to the roughness of the central region overlapping the red light emitting device.

Figure 18:
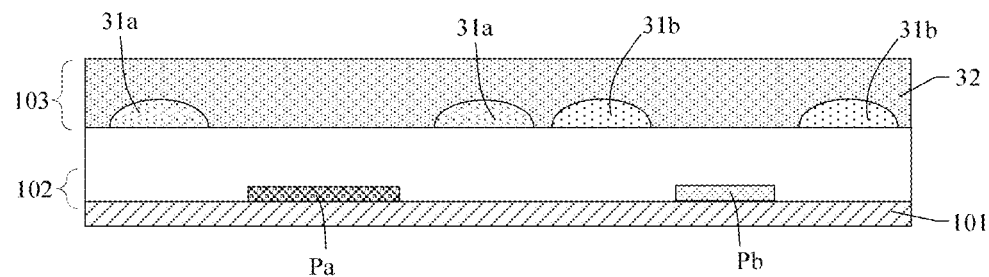
FIG. 18 is another cross-sectional schematic diagram of a display panel according to a representative embodiment of the present disclosure.
Figure 19:
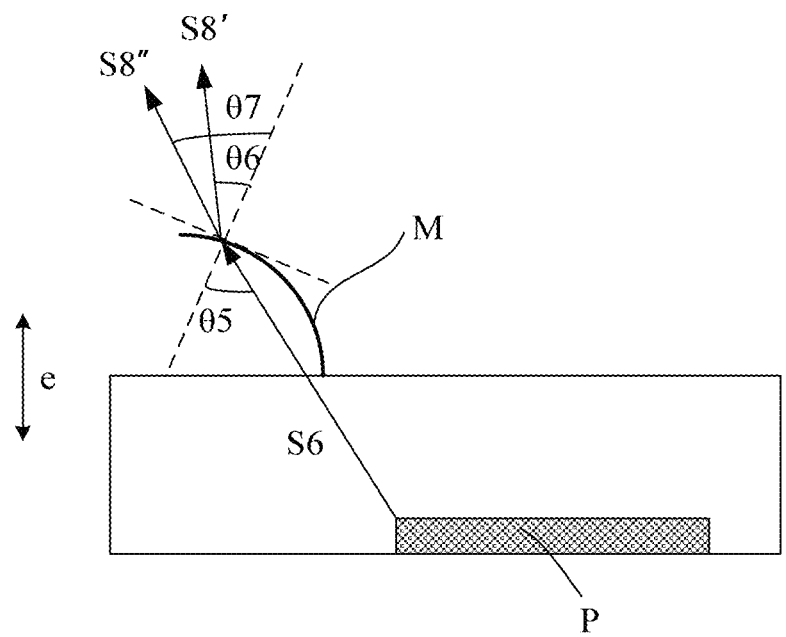
FIG. 19 is a schematic diagram of a principle of the corresponding embodiment of FIG. 18.

FIG. 18 illustrates another cross-sectional schematic diagram of a display panel according to an embodiment of the present disclosure. FIG. 19 illustrates a schematic diagram of a principle of the corresponding embodiment in FIG. 18. As shown in FIG. 18, a first light emitting device Pa and a second light emitting device Pb that emit light of different colors are shown, a light emitting area of the first light emitting device Pa is larger than that of the second light emitting device Pb, a refractive index of a light adjustment unit 31a corresponding to the first light emitting device Pa is n1, and a refractive index of a light adjustment unit 31b corresponding to the second light emitting device Pb is n2, where n1<n2.

As shown in the simplified schematic diagram of FIG. 19, one light emitting device P and an interface M between the light adjustment unit and the dielectric layer are illustrated, and the dielectric layer has a fixed refractive index. An incidence angle of light S7 to the interface M is θ5, and according to the law of refraction, when the refractive index of the light adjustment unit is n1 and refracted light of the light S7 is S8', the refraction angle is θ6; and when the refractive index of the light adjustment unit is n2 and the refracted light of the light S7 is S8", the refraction angle is θ7. Since n1<n2, then θ6<θ7. It can also be seen from the drawing that an angle between a propagation direction of the light S8' and the direction e is smaller than an angle between a propagation direction of the light S8" and the direction e. As a result, the smaller refractive index of the light adjustment unit leads to the smaller angle between the refracted light exiting from its interface with the dielectric layer and the direction e. That is, the smaller refractive index of the light adjustment unit leads to the better performance in adjusting the light path of the large-angle light emitted by the light emitting device. In the embodiment of the present disclosure, n1<n2, and thus the performance of the light adjustment unit 31a in adjusting the light path of the large-angle light is better than that of the light adjustment unit 31b, so that the amount of the increase in the light emission efficiency of the first light emitting device Pa is larger than the amount of the increase in the light emission efficiency of the second light emitting device Pb. Then, the difference in the light emission efficiency between the light emitting devices of different colors can be balanced by adjusting the amount of the increase in the light emission efficiency of the light emitting devices of different colors.

In an embodiment, the light emitting area of the blue light emitting device is larger than that of the green light emitting device, and the light emitting area of the green light emitting device is larger than that of the red light emitting device; the refractive index of the light adjustment unit corresponding to the blue light emitting device is smaller than the refractive index of the light adjustment unit corresponding to the green light emitting device, and the refractive index of the light adjustment unit corresponding to the green light emitting device is smaller than the refractive index of the light adjustment unit corresponding to the red light emitting device.

In another embodiment, the light emitting area of the green light emitting device is the same as that of the red light emitting device, and both are smaller than the light emitting area of the blue light emitting device; the refractive index of the light adjustment unit corresponding to the blue light emitting device is smaller than the refractive index of the light adjustment unit corresponding to the green light emitting device, and the refractive index of the light adjustment unit corresponding to the green light emitting device is equal to the refractive index of the light adjustment unit corresponding to the red light emitting device.

In another embodiment, the refractive index of the light adjustment unit corresponding to the blue light emitting device is smaller than the refractive index of the light adjustment unit corresponding to the green light emitting device, and the refractive index of the light adjustment unit corresponding to the green light emitting device is smaller than the refractive index of the light adjustment unit corresponding to the red light emitting device. The difference in light emission efficiency between light emitting devices of different colors can be balanced by adjusting the amount of the increase in the light emission efficiency of light emitting devices of different colors, and the light emitting area of the blue light emitting device, and the light emitting area of the red light emitting device and the light emitting area of the green light emitting device in this embodiment can be further set to be identical. In view of this, the light emitting devices of different colors can be manufactured using the same set of masks during the manufacturing process, so that the manufacturing process can be simplified.

Further, in some embodiments, after improving the light emission efficiency of the blue light emitting device by adjusting the refractive index of the light adjustment unit corresponding to the blue light emitting device, a light emitting brightness of the blue light emitting device can be reduced accordingly, so that the service life of the blue light emitting device can be increased.

It should be noted that the embodiments of the present disclosure do not make any limitation on the arrangement manner of the light emitting devices in the display panel, and the arrangement of the light emitting devices in the top view involved in a part of the above embodiments is representative.

Figure 20:
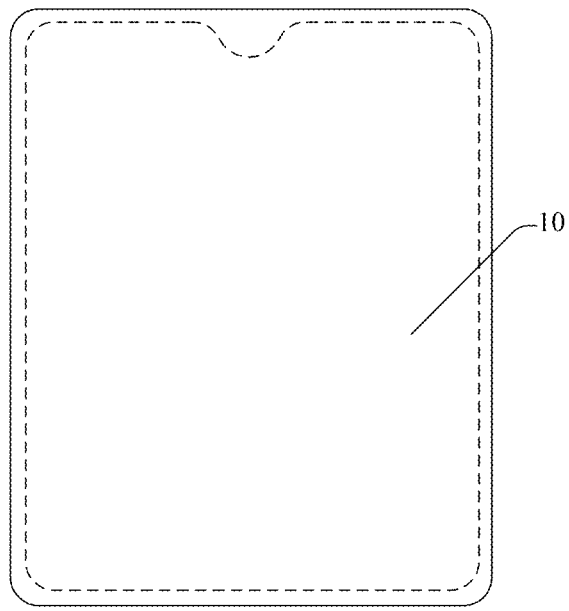
FIG. 20 is a schematic diagram of a display apparatus according to a representative embodiment of the present disclosure.

Based on the same inventive concept, the embodiments of the present disclosure further provide a display apparatus. FIG. 20 illustrates a schematic diagram of a display apparatus according to an embodiment of the present disclosure. As shown in FIG. 20, the display apparatus includes the display panel 10 according to any embodiment of the present disclosure. The display apparatus shown in FIG. 20 is for representative, and the display apparatus may be any electronic device having a display function, such as an on-board display apparatus, a mobile phone, a tablet computer, a notebook computer, an electronic paper book or a TV, a wearable mobile phone, or a watch.

Figure 21:
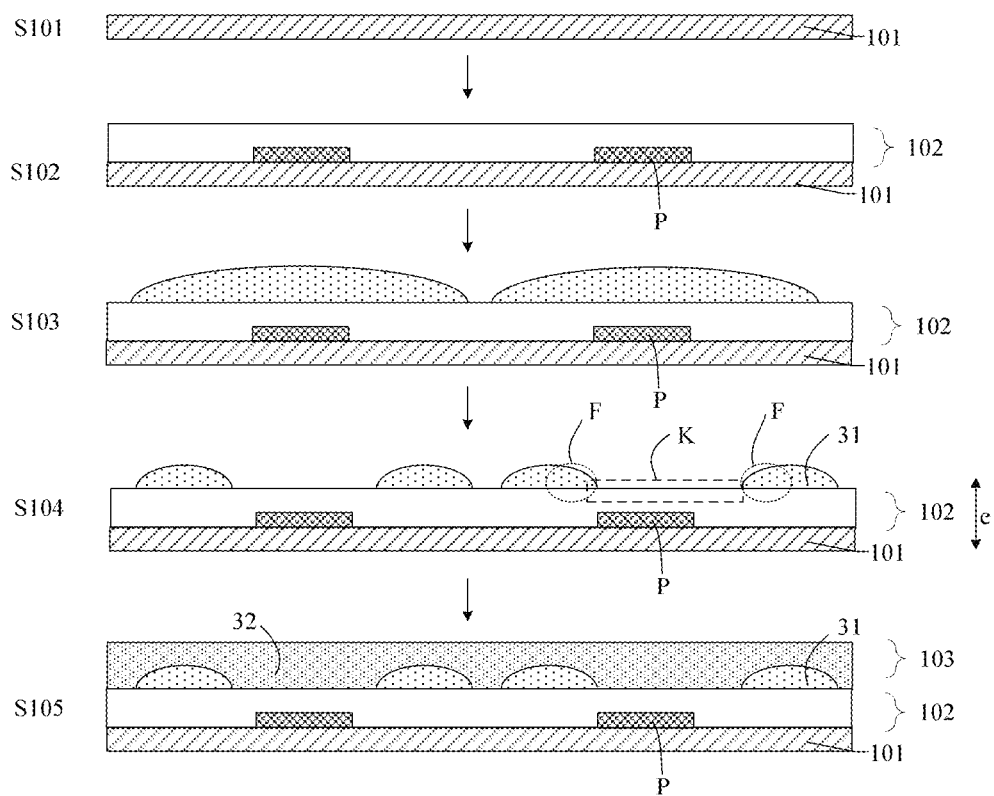
FIG. 21 is a first flowchart of a manufacturing method of a display panel according to a representative embodiment of the present disclosure.
Figure 22:
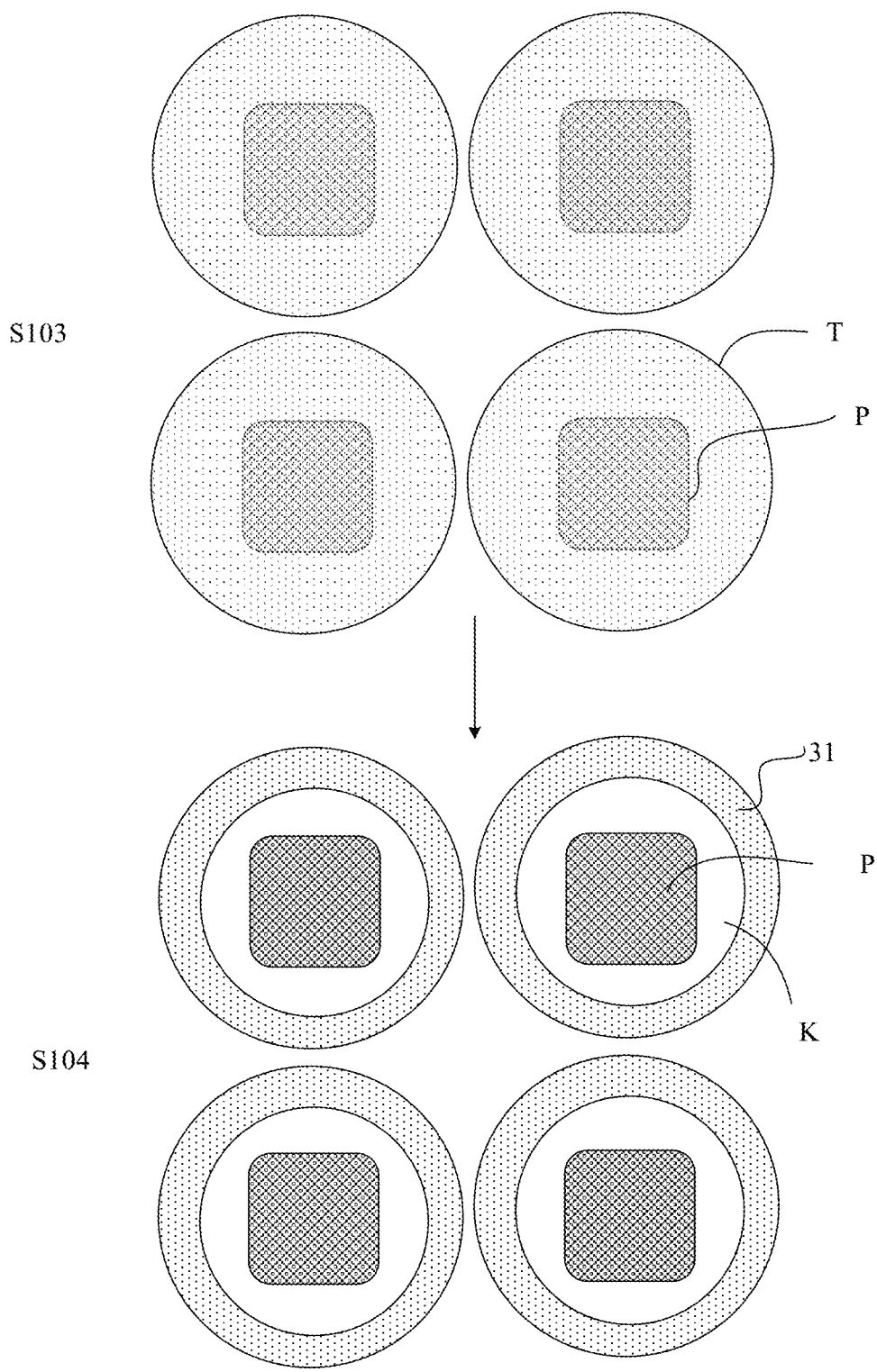
FIG. 22 is a second flowchart of a manufacturing method of a display panel according to a representative embodiment of the present disclosure.

Based on the same inventive concept, the embodiments of the present disclosure further provide a manufacturing method of a display panel, for manufacturing the display panel according to the embodiment of the present disclosure. FIG. 21 illustrates a first flowchart of a manufacturing method of a display panel according to an embodiment of the present disclosure, and FIG. 22 illustrates a second flowchart of a manufacturing method of a display panel according to an embodiment of the present disclosure. As shown in FIG. 21, the manufacturing method includes steps as follows.

At step S101, a base substrate 101 is provided.

At step S102, a light emitting device layer 102 is formed on the base substrate 101. The light emitting device layer 102 includes a plurality of light emitting devices P (two are shown for illustration), each of which may be an organic light emitting device, a miniature diode, or the like.

A light adjustment structure layer 103 is formed at a side of the light emitting device layer 102 facing away from the base substrate 101. This process may be completely by steps S103 and S104 in the following.

At step S103, a plurality of light adjustment unit precursor T is formed by an inkjet printing process.

At step S104, solvent is evaporated to obtain a plurality of light adjustment units 31. Each of the light adjustment units 31 includes a light adjustment sub-section F and a through hole K penetrating the light adjustment unit 31 in a direction e perpendicular to the base substrate. The through hole K overlaps the light emitting device P, and the light adjustment sub-section F surrounds the through hole K. For one light adjustment unit 31, a thickness of the light adjustment sub-section F gradually increases in a direction from the through-hole K towards the light adjustment sub-section F.

FIG. 22 is a schematic top view showing a partial region from step S103 to step S104 during the manufacturing process. The light adjustment unit 31 may be manufactured by an inkjet printing process, in which ink droplets are sprayed at a position corresponding to each light adjustment unit 31 (i.e., in a process of manufacturing the light adjustment unit precursor T), an evaporation amount of solvent at an edge of the ink droplet is much larger than an amount of loss of a liquid volume thereof, so the solvent is replenished from a central region to an edge, so as to form a capillary flow from inside to outside to make solute in the ink gather at the edge, and after the solvent is evaporated, the light adjustment unit 31 having through holes is formed. Moreover, the solute of the ink is the manufacturing material of the light adjustment unit.

As an example, a composition of the ink used in inkjet printing can also be adjusted during manufacturing, in order to reduce surface tension of the ink. Therefore, during the evaporation of the solvent. In view of this, it is more easily for the solvent in the adjustment unit precursor T to be replenished from the central region to the edge, so that the solute can gather at the edge.

At step S105, a dielectric layer 32 is formed on the plurality of light adjustment units 31. The light adjustment unit has a smaller refractive index than the dielectric layer 32. The dielectric layer 32 and the plurality of light adjustment units 31 together constitute the light adjustment structure layer 103.

In the manufacturing method according to this embodiment, first of all, the light adjustment unit precursor is formed by the inkjet printing process, and during the evaporation of the solvent in the ink, the ink in the central region of the light adjustment unit precursor is replenished to the edge, so that the solute in the ink gathers at the edge of the adjustment unit precursor; after the solvent is evaporated, a light adjustment unit having through holes is formed; then the dielectric layer is formed on the light adjustment unit, to finally form the light adjustment structure layer composed of the dielectric layer and the plurality of light adjustment units. The refractive index of the light adjustment unit is smaller than the refractive index of the dielectric layer. In addition, for the display panel manufactured in this manner, the light adjustment structure layer is formed on the light emitting device layer, so that the light path of the large-angle light emitted by the light emitting device can be adjusted to reduce the angle between this part of light and the direction perpendicular to the display panel, thereby reducing the chance that this part of the light will be totally reflected at the interface of the film layers in the display panel or at the interface between the display panel and the air. This can improve the light emission efficiency of the light emitting device, and thus the power consumption of the display panel can be reduced.

Figure 23:
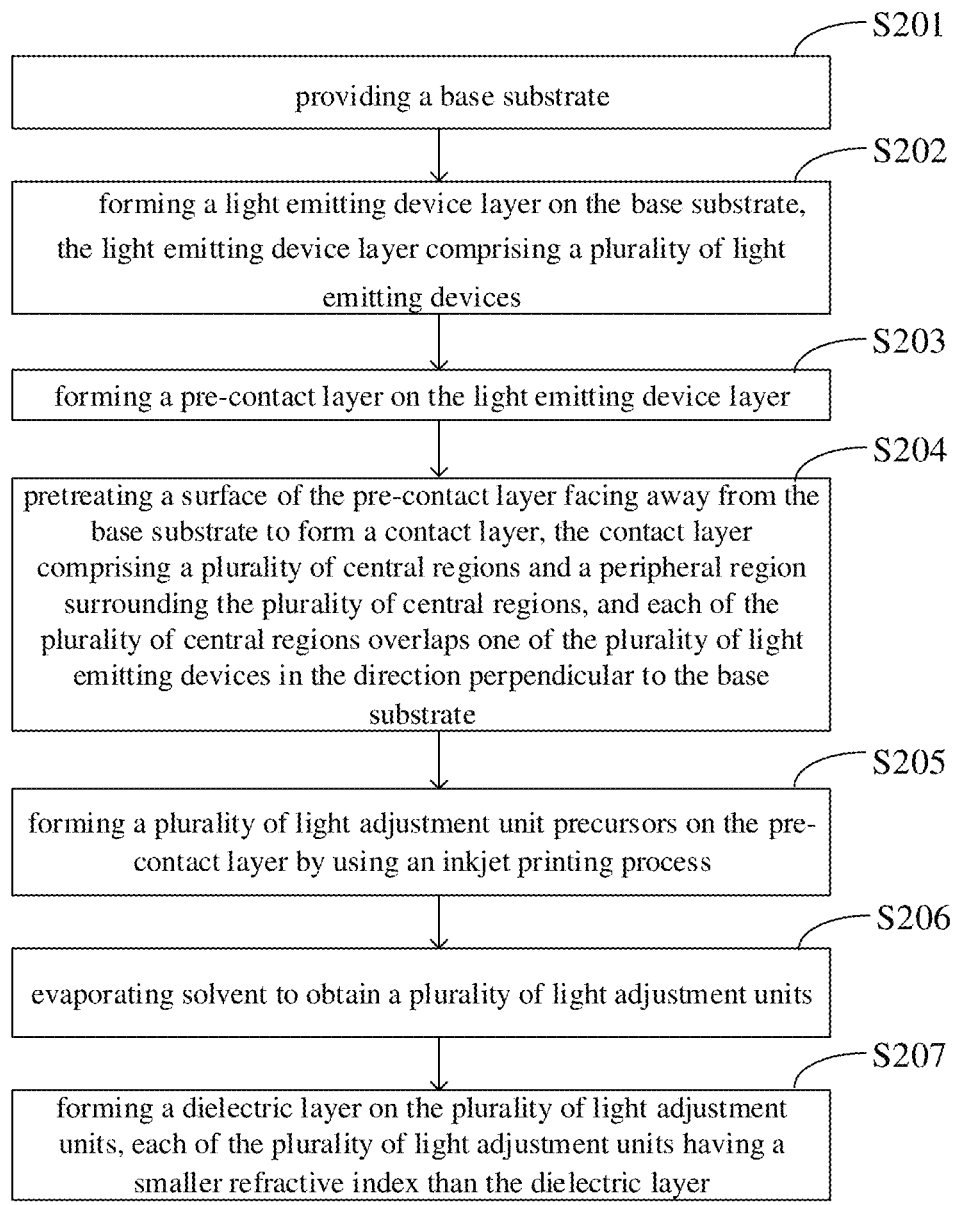
FIG. 23 is a third flowchart of a manufacturing method of a display panel according to a representative embodiment of the present disclosure.

In an embodiment, FIG. 23 illustrates a third flowchart of a manufacturing method of a display panel according to an embodiment of the present disclosure. As shown in FIG. 23, the manufacturing method includes steps as follows.

At step S201, a base substrate is provided.

At step S202, a light emitting device layer is formed on the base substrate. The light emitting device layer includes a plurality of light emitting devices.

At step S203, a pre-contact layer is formed on the light emitting device layer.

At step S204, a surface of the pre-contact layer facing away from the base substrate is pretreated to form a contact layer. The contact layer includes a plurality of central regions and a peripheral region surrounding the central regions, and the central region overlaps the light emitting device in a direction perpendicular to the base substrate. The central regions and the peripheral region formed after the pretreating have different characteristics. For example, the surface energy of the central region is smaller than the surface energy of the peripheral region, or the roughness of the central region is smaller than the roughness of the peripheral region.

At step S205, a plurality of light adjustment unit precursors is formed on the pre-contact layer by an inkjet printing process.

At step S206, solvent is evaporated to obtain a plurality of light adjustment units. Each of the light adjustment units includes a light adjustment sub-section and a through hole penetrating the light adjustment unit in a direction perpendicular to the base substrate. The through hole overlaps the light emitting device. The light adjustment sub-section surrounds the through hole. For one of the light adjustment units, a thickness of the light adjustment sub-section gradually increases in a direction from the through hole to the light adjustment sub-section.

At step S207, a dielectric layer is formed on the plurality of light adjustment units. The light adjustment unit has a smaller refractive index than the dielectric layer.

For the display panel manufactured in this manner, reference may be made to the schematic diagrams in FIG. 15 and FIG. 16 described above. In this embodiment, before manufacturing the light adjustment structure layer, the pre-contact layer is first formed, and the surface of the pre-contact layer facing away from the base substrate is pretreated to form the contact layer. Correspondingly, a central region and a peripheral region that have different characteristics are formed in the contact layer, and the difference in characteristics between the central region and the peripheral region can be considered in the formation of the light adjustment unit.

Further, step S205 uses the inkjet printing process to form the plurality of light adjustment unit precursors in such a manner that the plurality of light adjustment unit precursors covers the central region and at least part of the peripheral region. This embodiment can ensure that the through hole of the light adjustment unit formed after the evaporation of the solvent in the light adjustment unit precursor overlaps the light emitting device, and in the direction perpendicular to the base substrate, the light adjustment unit does not overlap the light emitting device, so as to ensure that the light adjustment structure layer adjusts the light path of the relatively large-angle light emitted by the light emitting device (e.g., adjusts only such a light path) without changing the light path of the relatively small-angle light emitted by the light emitting device. This can avoid adverse effects after adjusting the light path of the relatively small-angle light.

In one embodiment, the surface energy of the central region is smaller than the surface energy of the peripheral region, and after the light adjustment unit precursor is formed by the inkjet printing process, it is uneasy for the central region to be wetted by ink droplets, while the peripheral region is more easily wetted by ink droplets than the central region. During the evaporation of the solvent in the light adjustment unit precursor, the ink in the central region is more likely to gather towards the peripheral region. After the solvent evaporates, a light adjustment unit having through holes is formed. After the pretreating, a central region and a peripheral region that have different surface energy are formed, which can play an auxiliary role in the process of manufacturing the light adjustment unit. In addition, a difference between the surface energy of the central region and the surface energy of the peripheral region can be adjusted by adjusting pretreatment process parameters, so as to control an area of the through hole in the light adjustment unit. In the display panel, the plurality of light emitting devices includes a red light emitting device, a green light emitting device, and a blue light emitting device. In this way, the through holes overlapping the light emitting devices of different colors can be formed to have different areas based on design requirements.

Specifically, step S204 pretreats the surface of the pre-contact layer facing away from the base substrate to form the contact layer by the following process.

The pretreating of the surface of the pre-contact layer may be performed by using a plasma treatment process to form a plurality of central regions and a peripheral region. The plasma treatment process can increase the surface energy of the surface of the film layer. The surface of the pre-contact layer is divided into a first pretreatment region and a second pretreatment region. In the direction perpendicular to the base substrate, the first pretreatment region overlaps the light emitting device, and the second pretreatment region surrounds the first pretreatment region. The plasma treatment process is used to pretreat the second pretreatment region (e.g., only the second pretreatment region) to form the peripheral region while increasing the surface energy, and the first pretreatment region forms the central region without the pretreatment.

The pretreating of the surface of the pre-contact layer may be performed by an AUV process to form a plurality of central regions and a peripheral region. The UV process can increase the surface energy of the surface of the film layer. The surface of the pre-contact layer is divided into a first pretreatment region and a second pretreatment region. In the direction perpendicular to the base substrate, the first pretreatment region overlaps the light emitting device, and the second pretreatment region surrounds the first pretreatment region. The UV process is used to pretreat the second pretreatment region (e.g., only to pretreat the second pretreatment region) to form a peripheral region while increasing the surface energy, and the first pretreatment region forms the central region without the pretreatment.

The pretreating of the surface of the pre-contact layer may be performed by a hydrophilic or hydrophobic process to form a plurality of central regions and a peripheral region. The surface of the pre-contact layer is divided into a first pretreatment region and a second pretreatment region. In the direction perpendicular to the base substrate, the first pretreatment region overlaps the light emitting device, and the second pretreatment region surrounds the first pretreatment region. For example, the hydrophobic process is used to pretreat the first pretreatment region to form a central region, and the second pretreatment region forms a peripheral region without the pretreating. As another example, the hydrophilic process is used to pretreat the second pretreatment region to form a peripheral region, and the first pretreatment region forms a central region without the pretreating. As a further example, the hydrophobic process is used to pretreat the first pretreatment region to form a central region, and the second pretreatment region is pretreated by the hydrophilic process to form a peripheral region.

In another embodiment, the roughness of the central region is smaller than the roughness of the peripheral region, so that after the light adjustment unit precursor is form by the inkjet printing process, it is uneasy for the central region to be wetted by ink droplets, while the peripheral region is more easily wetted by ink droplets than the central region. During the evaporation of the solvent in the light adjustment unit precursor, the ink in the central region is more likely to gather towards the peripheral region, and after the solvent evaporates, a light adjustment unit having through holes is formed. After the pretreating, a central region and a peripheral region that have different roughness are formed, which can play an auxiliary role in the process of manufacturing the light adjustment unit. In addition, a difference between the roughness of the central region and the peripheral region can be adjusted by adjusting pretreatment process parameters, so as to control an area of the through hole in the light adjustment unit. In the display panel, the plurality of light emitting devices includes a red light emitting device, a green light emitting device, and a blue light emitting device. In this way, the through holes overlapping the light emitting devices of different colors can be formed to have different areas based on design requirements.

Specifically, step S204 pretreats the surface of the pre-contact layer facing away from the base substrate to form a contact layer by the following process. A nanocrystalline layer is formed on the pre-contact layer to form a plurality of central regions and a peripheral region. The larger density of nanoparticles in the nanocrystalline layer leads to the smaller surface roughness. The surface of the pre-contact layer is divided into a first pretreatment region and a second pretreatment region. In the direction perpendicular to the base substrate, the first pretreatment region overlaps the light emitting device, and the second pretreatment region surrounds the first pretreatment region. A nanocrystalline layer having a relatively high density is formed in the first pretreatment region to form a central region, and a nanocrystalline layer having a relatively low density is formed in the second pretreatment region to form a peripheral region.

The above are representative embodiments of the present disclosure and are not intended to limit the present disclosure. Any modifications, equivalents, improvements, etc., which are made within the spirit and principles of the present disclosure, should be included in the scope of the present disclosure.

Finally, it should be noted that, the above-described embodiments are for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
    a base substrate;
    a light emitting device layer provided on the base substrate, the light emitting device layer comprising a plurality of light emitting devices; and
    a light adjustment structure layer provided at a side of the light emitting device layer facing away from the base substrate, wherein the light adjustment structure layer comprises light adjustment units corresponding to the plurality of light emitting devices, and on an orthogonal projection of the base substrate, a light adjustment unit has a ring shape and is disposed around a corresponding light emitting device, the light adjustment unit comprises a through hole overlapping the corresponding light emitting device,
    wherein the plurality of light emitting devices comprise a first light emitting device and a second light emitting device, a color of light emitted from the first light emitting device is different from a color of light emitted from the second light emitting device, and a light emitting area of the first light emitting device is greater than a light emitting area of the second light emitting device,
    the through holes of the light adjustment units comprise a first through hole overlapping the first light emitting device and a second through hole overlapping the second light emitting device, and an area of the first through hole is greater than an area of the second through hole.

2. The display panel according to claim 1, wherein the first light emitting device is a blue light emitting device, and the second light emitting device is a red light emitting device, or
    wherein the first light emitting device is the blue light emitting device, and the second light emitting device is a green light emitting device, or
    wherein the first light emitting device is the green light emitting device, and the second light emitting device is the red light emitting device.

3. The display panel according to claim 1, further comprising: a dielectric layer covering the light adjustment unit, wherein a refractive index of the light adjustment unit is less than that of the dielectric layer.

4. The display panel according to claim 1, wherein the light adjustment unit further comprises a light adjustment sub-section surrounding the through hole, and along a direction from the through hole to the light adjustment sub-section, a thickness of the light adjustment sub-section progressively increases.

5. The display panel according to claim 4, further comprising: a dielectric layer covering the light adjustment unit, wherein an interface between the dielectric layer and the light adjustment sub-section is an arc-shaped surface.

6. The display panel according to claim 4, further comprising: a dielectric layer covering the light adjustment unit, wherein an interface between the dielectric layer and the light adjustment sub-section is a convex surface protruding from the light emitting device layer along a direction away from the base substrate.

7. The display panel according to claim 1, wherein the light adjustment unit comprises a first surface protruding along a direction away from the base substrate.

8. The display panel according to claim 1, wherein the light adjustment unit is in a ring-shaped convex lens structure, and the through hole of the light adjustment unit is at a center of the ring-shaped convex lens structure.

9. The display panel according to claim 1, further comprising an encapsulation layer and a touch film group layer,
    wherein the encapsulation layer and the touch film group layer are both located between the light emitting device layer and the light adjustment structure layer, and
    the encapsulation layer is located between the touch film group layer and the light emitting device layer, and comprises at least one organic encapsulation layer and at least one inorganic encapsulation layer.

10. The display panel according to claim 1, wherein the light adjustment units are spaced apart from each other.

11. The display panel according to claim 1, wherein the light adjustment units comprise a first light adjustment unit and a second light adjustment unit, and the first light adjustment unit and the second light adjustment unit are in contact with each other.

12. A display device comprising a display panel, wherein the display panel comprises:
    a base substrate;
    a light emitting device layer provided on the base substrate, the light emitting device layer comprising a plurality of light emitting devices; and
    a light adjustment structure layer provided at a side of the light emitting device layer facing away from the base substrate, wherein the light adjustment structure layer comprises light adjustment units corresponding to the plurality of light emitting devices, and on an orthogonal projection of the base substrate, a light adjustment unit has a ring shape and is disposed around a corresponding light emitting device, and the light adjustment unit comprises a through hole overlapping the corresponding light emitting device,
    wherein the plurality of light emitting devices comprise a first light emitting device and a second light emitting device, a color of light emitted from the first light emitting device is different from a color of light emitted from the second light emitting device, and a light emitting area of the first light emitting device is greater than a light emitting area of the second light emitting device,
    the through holes of the light adjustment units comprise a first through hole overlapping the first light emitting device and a second through hole overlapping the second light emitting device, and an area of the first through hole is greater than an area of the second through hole.

* * * * *